US009088285B2

(12) United States Patent
Goldblatt et al.

(10) Patent No.: US 9,088,285 B2
(45) Date of Patent: Jul. 21, 2015

(54) DYNAMIC DIVIDER HAVING INTERLOCKING CIRCUIT

(71) Applicant: QUALCOMM Incorporated, San Diego, CA (US)

(72) Inventors: Jeremy Mark Goldblatt, San Diego, CA (US); Devavrata Vasant Godbole, Carlsbad, CA (US); Hsuanyu Pan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/926,923

(22) Filed: Jun. 25, 2013

(65) Prior Publication Data

US 2014/0376683 A1     Dec. 25, 2014

(51) Int. Cl.
| H03K 21/00 | (2006.01) |
| H03K 23/00 | (2006.01) |
| H03K 21/17 | (2006.01) |
| H03K 5/15 | (2006.01) |
| H03K 23/42 | (2006.01) |

(52) U.S. Cl.
CPC ............ *H03K 21/17* (2013.01); *H03K 5/15033* (2013.01); *H03K 23/425* (2013.01)

(58) Field of Classification Search
None
See application file for complete search history.

(56) References Cited

U.S. PATENT DOCUMENTS

| 5,592,114 A | * | 1/1997 | Wu et al. .......................... 327/208 |
| 6,100,730 A | * | 8/2000 | Davis et al. ..................... 327/117 |
| 6,130,564 A | * | 10/2000 | Wang ............................. 327/117 |
| 6,597,212 B1 | * | 7/2003 | Wang et al. .................... 327/117 |
| 7,573,305 B1 | | 8/2009 | Cosand et al. |
| 7,602,877 B2 | * | 10/2009 | Shimada ........................... 377/47 |
| 7,719,326 B2 | * | 5/2010 | Casagrande et al. .......... 327/115 |
| 7,948,279 B2 | | 5/2011 | Lin |
| 8,045,674 B2 | | 10/2011 | Li |
| 8,502,573 B2 | * | 8/2013 | Tsai .............................. 327/115 |
| 8,704,559 B2 | * | 4/2014 | Fong et al. .................... 327/141 |
| 8,791,729 B2 | * | 7/2014 | Woelk et al. ................... 327/117 |

(Continued)

FOREIGN PATENT DOCUMENTS

| WO | 9715116 A2 | 4/1997 |
| WO | WO-2005/117266 A1 | 12/2005 |
| WO | WO-2014/062983 A3 | 4/2014 |

OTHER PUBLICATIONS

Huang, Q., et al., "Speed Optimization of Edge-Triggered CMOS Circuits for Gigahertz Single-Phase Clocks," IEEE Journal of Solid-State Circuits, vol. 31, No. 3, Mar. 1996, pp. 456-465.

(Continued)

*Primary Examiner* — Tuan T Lam
(74) *Attorney, Agent, or Firm* — Arent Fox LLP

(57) ABSTRACT

A high-speed and low power divider includes a ring of four dynamic latches, an interlocking circuit, and four output inverters. Each latch has a first dynamic node M and a second dynamic node N. The interlocking circuit is coupled to the M nodes. Based on one or more of the M node signals received, the interlocking circuit selectively controls the logic values on one or more of the M modes such that over time, as the divider is clocked, only one of the signals on the N nodes is low at a given time. The output inverters generate inverted versions of the N node signals that are output from the divider as low phase noise 25% duty cycle output signals I, IB, Q and QB. In one specific example, each latch has eight transistors and no more than eight transistors. The divider recovers quickly and automatically from erroneous state disturbances.

20 Claims, 11 Drawing Sheets

(56) References Cited

U.S. PATENT DOCUMENTS

| | | | |
|---|---|---|---|
| 2006/0109947 A1* | 5/2006 | Austin et al. | 377/47 |
| 2007/0024329 A1* | 2/2007 | Heidari et al. | 327/115 |
| 2009/0167373 A1* | 7/2009 | Song | 327/115 |
| 2009/0256596 A1 | 10/2009 | Oh | |
| 2010/0111244 A1 | 5/2010 | Fattaruso | |
| 2010/0253398 A1 | 10/2010 | Seckin | |
| 2012/0007638 A1* | 1/2012 | Meng et al. | 327/115 |
| 2014/0103984 A1 | 4/2014 | Goldblatt et al. | |

OTHER PUBLICATIONS

Ji-Ren Y. et al., "A True Single-Phase-Clock Dynamic CMOS Circuit Technique," Solid-State Circuits, IEEE Journal of, vol. sc-22, No. 5, pp. 899-901, Oct. 1987 DOI: 10.1109/JSSC.1987.1052831.

Partial International Search Report—PCT/US2014/042952—ISA/EPO—Oct. 24, 2014.

International Search Report and Written Opinion—PCT/US2014/042952—ISA/EPO—Jan. 14, 2015 (23 total pages).

* cited by examiner

SYMBOL OF DIVIDER

TSPC LATCH OF THE DIVIDER OF FIG. 8

WAVEFORMS IN THE TSPC LATCH OF FIG. 9

WAVEFORMS IN THE DIVIDER OF FIG. 8

SYMBOL OF DIVIDER

DYNAMIC NODES "M" ARE INTERCOUPLED VIA THE INTERLOCKING CIRCUIT
SO THAT THE LATCHES PUT THEMSELVES INTO PROPER STATES WITH
RESPECT TO ONE ANOTHER.

EIGHT TRANSISTOR DYNAMIC
LATCH OF THE DIVIDER OF FIG. 13

OPERATION OF THE DIVIDER OF FIG. 13

| | DIVIDER OF FIG. 13 | | | | | DIVIDER OF FIG. 8 | | DIVIDER OF FIG. 3 | |
|---|---|---|---|---|---|---|---|---|---|
| PROCESS CORNER | TT | SS | SS | FF | FF | TT | SS | TT | SS |
| VDD (VOLTS) | 0.9 | 0.9 | 0.9 | 0.9 | 0.9 | 0.9 | 0.9 | 0.9 | 0.9 |
| TEMP (°C) | 50 | 110 | -30 | 110 | -30 | 50 | 110 | 50 | 110 |
| CLK FREQUENCY (GHz) | 2.2 | 2.2 | 2.2 | 2.2 | 2.2 | 2.2 | 2.2 | 2.2 | 2.2 |
| OUTPUT SLEW RATE (RISING) GV/s | 24.38 | 19.74 | | 32.7 | 34.23 | 28.52 | 14.3 | 29.96 | 14.89 |
| OUTPUT SLEW RATE (FALLING) GV/s | 22.53 | 16.12 | | 27.74 | 30.9 | 25.69 | 20.18 | 28.04 | 18.54 |
| TOTAL CURRENT (W DIVERSITY) mA | 10.94 | 10.58 | | 11.84 | 11.15 | 12.42 | 11.74 | 13.03 | 11.54 |
| DIVIDER AND PREDIVIDER BUFFER mA | 3.752 | 3.51 | | 4.16 | 3.83 | 4.29 | 3.823 | 5.03 | 3.43 |
| VCO BUFFER CURRENT mA | 3.16 | 3.2 | | 3.69 | 3.49 | 3.41 | 3.158 | 3.2 | 3.011 |
| PHASE NOISE 80MHz dBc/Hz | -155.7 | -153.2 | | -157.9 | -156.7 | -154.9 | -141.5 | -154.8 | -147 |
| PHASE NOISE 190MHz dBc/Hz | -157.4 | -154.7 | | -159.4 | -158.9 | -156.4 | -142.7 | -155.6 | -148.8 |
| DTC% | 29.48 | 31.46 | | 28.38 | 28.82 | 32.10 | 34.67 | 30.84 | 32.05 |

DIVIDER PERFORMANCE

FIG. 16

DYNAMIC DIVIDER HAVING INTERLOCKING CIRCUIT

BACKGROUND INFORMATION

1. Technical Field

The present disclosure relates to high-speed latches and to high-speed dividers.

2. Background Information

A type of passive mixer in a downconverter of a radio receiver, or in an upconverter of a radio transmitter, is to be driven by 25% duty cycle signals I, IB, Q and QB. The I and Q signals differ from each other by 90 degrees. Signal IB is 180 degrees out of phase with respect to signal I. Signal QB is 180 degrees out of phase with respect to signal Q. The four 25% duty cycle signals are typically generated using a Phase-Locked Loop (PLL), where the PLL outputs a differential signal that in turn is divided down in frequency by two by a divide-by-two divider. The divide-by-two divider outputs the four 25% duty cycle signals I, IB, Q and QB that are supplied to drive the mixer. Such a divide-by-two divider can be made using two latches.

FIG. 1 (Prior Art) is a diagram of one type of latch. The latch is a dynamic latch that has nine transistors. The state of the latch is stored on the capacitance of a node within the circuit. The latch of FIG. 1, however, outputs a 50% duty cycle signal on the node QB. For addition information on the latch of FIG. 1, see: J. Yuan and C. Svensson, "A True Single-Phase-Clock Dynamic CMOS Circuit Technique", IEEE J. Solid-State Circuits, vol. SC-22, no. 5, pages 899-901 (October 1987).

FIG. 2 (Prior Art) is a diagram of another type of dynamic latch. The latch is illustrated with its QB output coupled back to its D input to make a toggling circuit. Unfortunately, the toggling circuit of FIG. 2 outputs a 50% duty cycle signal. For addition information on the latch of FIG. 2, see: Q. Huang and R. Rogenmoser, "Speed Optimization Of Edge-Triggered CMOS For GHz Single-Phase Clock", IEEE Journal of Solid-State Circuits, vol. 31, no. 3, pages 456-464 (March 1996).

FIG. 3 (Prior Art) is a diagram of a prior art divider that does output 25% duty cycle signals. The divider is sometimes referred to as a pseudo-CML divider. Incoming clock signals are received into the Gm block shown at the top of the diagram. The circuit then outputs 25% duty cycle output signals I, IB, Q and QB, where the output signals are taken from the nodes between the P-channel and N-channel transistors. Although the circuit of FIG. 3 outputs the desired 25% duty cycle signals, the circuit consumes a lot of current. An improved divider circuit is sought that outputs 25% duty cycle signals suitable to drive the passive mixer, but that consumes a smaller amount of current than the circuit of FIG. 3.

SUMMARY

A high-speed and low power divider circuit is disclosed. The divider circuit includes a ring of four dynamic latches, an interlocking circuit, and a set of four output inverters. A first dynamic node M1 of the first dynamic latch is coupled to a D2 data input of the second dynamic latch. A first dynamic node M2 of the second dynamic latch is coupled to a D3 data input of the third dynamic latch. A first dynamic node M3 of the third dynamic latch is coupled to a D4 data input of the fourth dynamic latch. A first dynamic node M4 of the fourth dynamic latch is coupled to a D1 data input of the first dynamic latch. The first and third dynamic latches are clocked on a first phase of an incoming clock signal, whereas the second and fourth dynamic latches are clocked on a second phase of the incoming clock signal. Each of the four dynamic latches, in addition to having a first dynamic node M, also has a second dynamic node N. The second dynamic nodes of the first, second, third and fourth dynamic latches are denoted N1, N2, N3 and N4, respectively.

The interlocking circuit is coupled the first dynamic nodes M1, M2, M3 and M4 of the four dynamic latches. Based on the signals on one or more of the dynamic nodes M1, M2, M3 and M4, the interlocking circuit selectively controls the logic values on one or more of the M1, M2, M3 and M4 nodes such that over time, as the divider is clocked, only one of the signals on the N1, N2, N3 and N4 nodes is low at a given time. The only signals received by the interlocking circuit are signals from the latches. The interlocking circuit does not receive a reset signal or another digital control signal from outside the divider circuit. The interlocking circuit does not operate in a first initialization mode to set the states of the latches, and then operate in a normal operation mode. Rather, the interlocking circuit operates continuously in the same one mode. Due to the interdependence of the states of the latches via the interlocking circuit, the divider circuit recovers quickly and automatically from erroneous state disturbances of the latches.

In one specific example, the interlocking circuit includes four N-channel pulldown transistors. If the signal on the M1 dynamic node is high, then the first N-channel pulldown transistor pulls the voltage on the M3 dynamic node low. If the signal on the M3 dynamic node is high, then the second N-channel pulldown transistor pulls the voltage on the M1 dynamic node low. If the signal on the M2 dynamic node is high, then the third N-channel pulldown transistor pulls the voltage on the M4 dynamic node low. If the signal on the M4 dynamic node is high, then the fourth N-channel pulldown transistor pulls the voltage on the M2 dynamic node low. A "high" here may denote a signal voltage that is between supply voltage VDD and half of VDD, whereas a "low" here may denote a signal that is between ground potential and half of VDD. A "high" may be referred to as a high signal level, or a high logic level, or a high value. A "low" may be referred to as a low signal level, or a low logic level, or a low value.

If the states of the four dynamic latches become disturbed such that more than one signal on an N dynamic node is low at a given time, then the interlocking circuit operates as the ring of latches is clocked to set the states of the latches so that one and only one N node signal is low at a given time.

When the divider circuit is operating normally, as the divider circuit is clocked the one dynamic node N that has the low state circulates around the ring from latch to latch. During a first clock half period the low state is on the N node of the first latch, during a second clock half period the low state is on the N node of the second latch, during a third clock half period the low state is on the N node of the third latch, and during a fourth clock half period the low state is on the N node of the fourth latch.

In one specific example, each dynamic latch has eight transistors and no more than eight transistors. A first P-channel transistor and a second P-channel transistor are coupled in series between a supply voltage conductor and the first dynamic node M of the latch. A first N-channel transistor and a second N-channel transistor are coupled in series between the first dynamic node M and a ground conductor. A gate of the first P-channel transistor and a gate of the second N-channel transistor are coupled to a D input signal node of the latch. A gate of the first N-channel transistor is coupled to an inverted clock signal input node CLKB of the latch. A third P-channel transistor is coupled between the supply voltage conductor and the second dynamic node N of the latch. A third N-channel transistor and a fourth N-channel transistor are coupled in series between the second dynamic node N and the ground conductor. A gate of the third N-channel transistor is coupled to the first dynamic node M. A gate of the fourth N-channel transistor is coupled to a gate of the third P-channel transistor and to a gate of the second P-channel transistor and to a clock signal input node CLK of the latch. A fourth P-channel transistor is coupled between the supply voltage conductor and a QB output signal node of the latch. A gate of the fourth P-channel transistor is coupled to the second dynamic node N.

The four output inverters of the latch are coupled to generate inverted versions of the signals on the N1, N2, N3 and N4 nodes of the ring of latches. The corresponding resulting output signals I, Q, IB and QB are 25% duty cycle signals. Output signal I is the inverted version of the signal on node N1. Output signal Q is the inverted version of the signal on node N2. Output signal IB is the inverted version of the signal on node N3. Output signal QB is the inverted version of the signal on node N4. In one application, the divider circuit supplies the I, IB, Q and QB output signals to a passive mixer in a radio receiver, or in a radio transmitter. As compared to another divider circuit having dynamic latches, the divider circuit having the interlocking circuit has lower power consumption and its output signals have less phase noise.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 16 is a table that sets forth performance parameters of the second embodiment 100 of the divider circuit of FIG. 13, in comparison to performance parameters for the first embodiment 38 of the divider circuit of FIG. 8, and in comparison to performance parameters for the divider circuit of FIG. 3.

DETAILED DESCRIPTION

Reference will now be made in detail to background examples and some embodiments of the invention, examples of which are illustrated in the accompanying drawings. In the description and claims below, when a node is said to be connected to, or coupled to, another node, it is understood that the two nodes are actually one node. Similarly, if a lead or conductor is said to be coupled to a node, or if a node is said to be coupled to a lead or conductor, it is understood that the lead, conductor and node are together one node.

Figure 4:
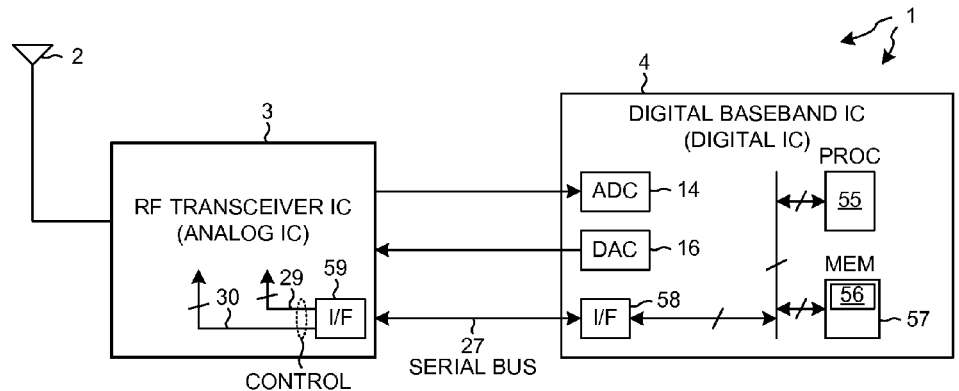
FIG. 4 is a very simplified high level block diagram of a mobile communication device 1 in accordance with one novel aspect.

FIG. 4 is a very simplified high level block diagram of a mobile communication device 1 in accordance with one novel aspect. In this example, mobile communication device 1 is a cellular telephone. The cellular telephone includes (among several other components not illustrated) an antenna 2 and two integrated circuits 3 and 4. Integrated circuit 4 is called a "digital baseband integrated circuit." Integrated circuit 3 is a Radio Frequency (RF) transceiver integrated circuit. RF transceiver integrated circuit 3 is called a "transceiver" because it includes a transmitter as well as a receiver.

Figure 5:
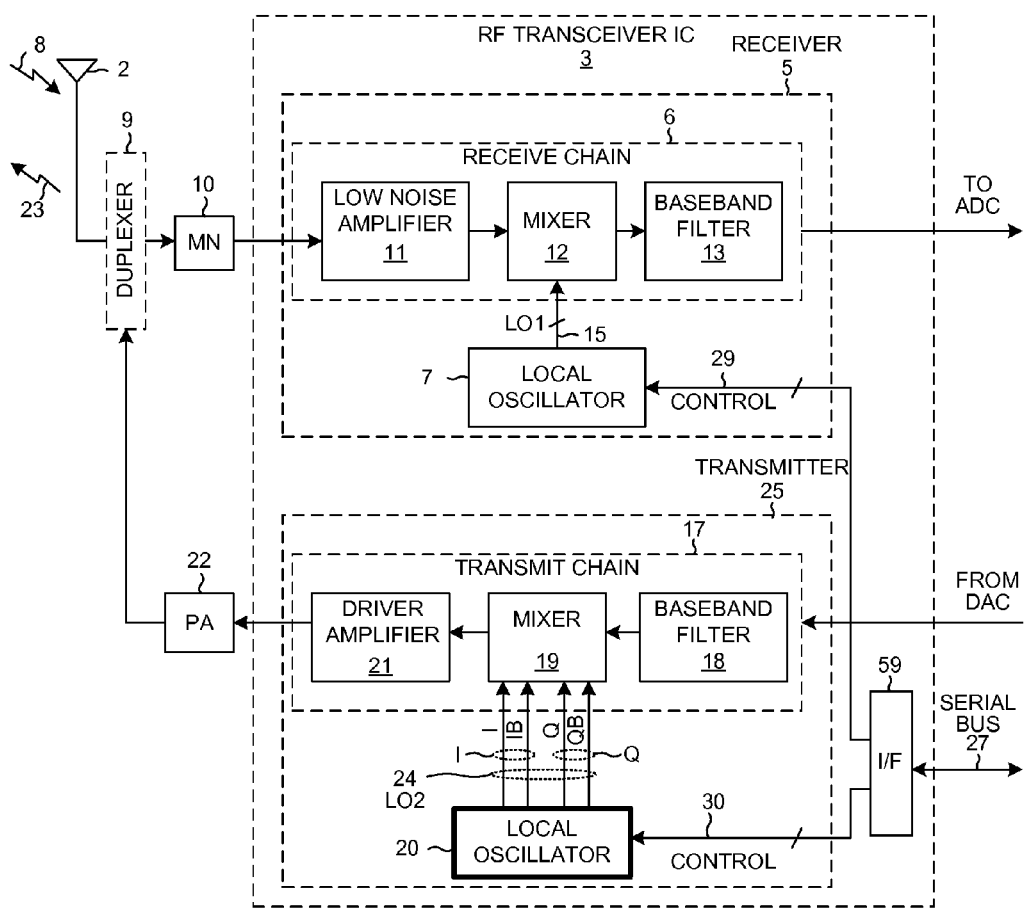
FIG. 5 is a more detailed block diagram of the RF transceiver integrated circuit 3 of FIG. 4.

FIG. 5 is a more detailed block diagram of the RF transceiver integrated circuit 3 of FIG. 4. A receiver 5 includes what is called a "receive chain" 6 as well as a Local Oscillator (LO) 7. When the cellular telephone 1 is receiving, a high frequency RF signal 8 is received on antenna 2. Information from signal 8 passes through duplexer 9, matching network 10, and through the receive chain 6. Signal 8 is amplified by Low Noise Amplifier (LNA) 11 and is down-converted in frequency by mixer 12. The resulting down-converted signal is filtered by baseband filter 13 and is passed to the digital baseband integrated circuit 4. An analog-to-digital converter 14 in the digital baseband integrated circuit 4 converts the signal into digital form and the resulting digital information is processed by digital circuitry in the digital baseband integrated circuit 4. The digital baseband integrated circuit 4 tunes the receiver by controlling the frequency of the Local Oscillator (LO1) signal supplied on local oscillator outputs 15 to mixer 12.

If the cellular telephone 1 is transmitting, then information to be transmitted is converted into analog form by a Digital-to-Analog Converter (DAC) 16 in the digital baseband integrated circuit 4 and is supplied to a "transmit chain" 17 in the RF transceiver integrated circuit 3. Baseband filter 18 then filters out noise due to the digital-to-analog conversion process. Mixer block 19 under control of local oscillator 20 then up-converts the signal into a high frequency signal. Driver amplifier 21 and an external power amplifier 22 amplify the high frequency signal to drive antenna 2 so that a high frequency RF signal 23 is transmitted from antenna 2. The digital baseband integrated circuit 4 controls the transmitter 25 by controlling the frequency of a Local Oscillator (LO2) signal 24 that is supplied to mixer 19. Transmitter 25 includes the transmit chain 17 and the local oscillator 20. Local oscillator signal LO2 24 includes a differential In-phase (I) signal and a differential Quadrature (Q) signal that are supplied via conductors 26-29 to mixer 19. Digital baseband integrated circuit 4 controls the local oscillators 7 and 20 by sending appropriate control information across serial bus 27, through bus interface 59, and control lines 29 and 30.

Figure 6:
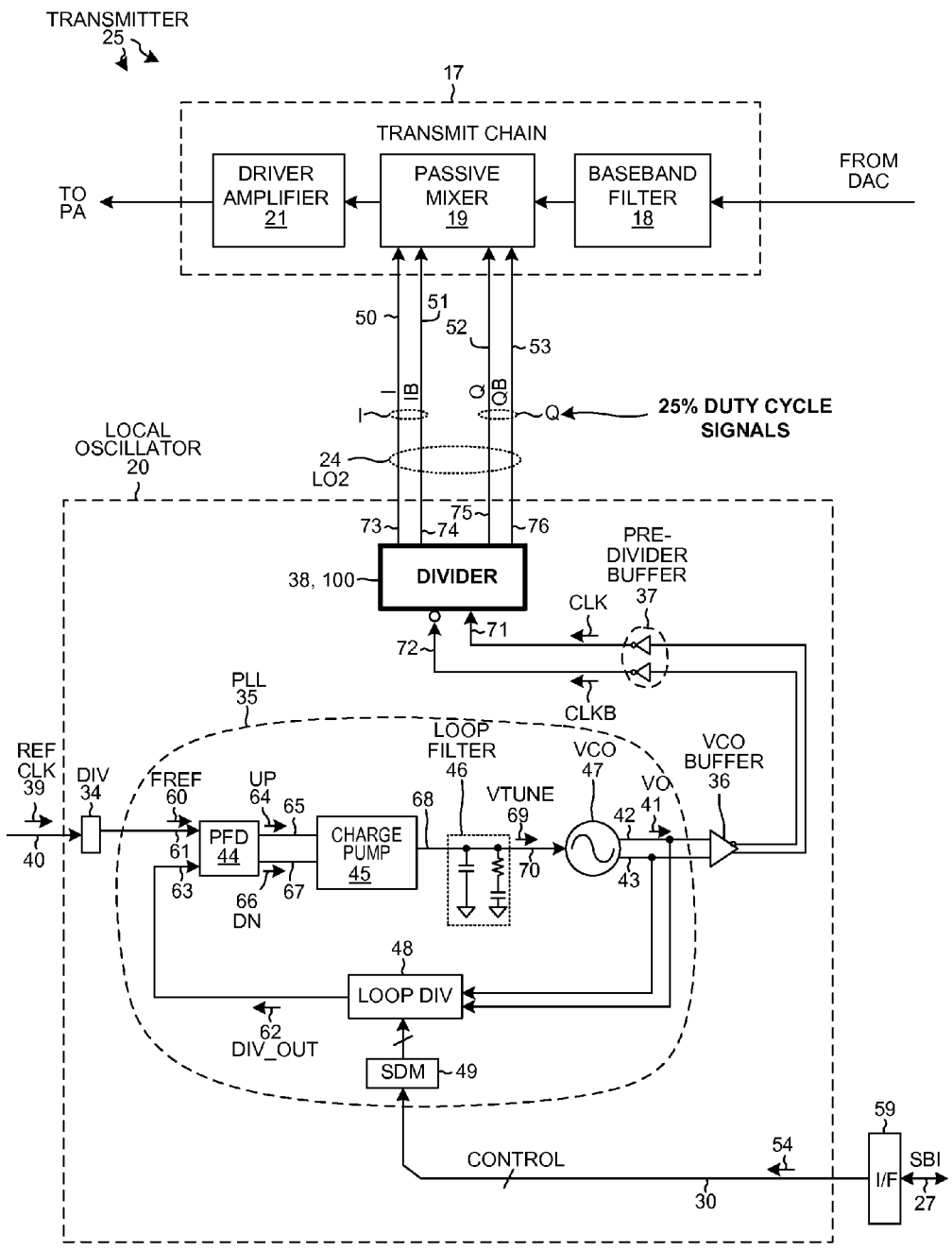
FIG. 6 is a more detailed diagram of the local oscillator 20 of the transmitter in the RF transceiver integrated circuit 3 of FIG. 5.

FIG. 6 is a more detailed diagram of local oscillator 20 of the transmitter 25 in the RF transceiver integrated circuit 3 of FIG. 5. Local oscillator 20 includes divider 34, a Phase-Locked Loop (PLL) 35, a Voltage Controlled Oscillator (VCO) buffer 36, a pre-divider buffer 37, and a first embodiment 38 of a divider circuit. PLL 35 receives an externally generated reference signal REF CLK 39 on conductor 40 (for example, a 19.2 MHz signal generated by an external crystal oscillator) and generates therefrom a differential PLL output signal VO 41 on conductors 42 and 43. The label "VO" used here indicates that the VO signal is the VCO output signal. The PLL 35 in this example includes a Phase-Frequency Detector (PFD) 44, a charge pump 45, a loop filter 46, a Voltage Controlled Oscillator (VCO) 47, a loop divider 48, and a Sigma-Delta Modulator (SDM) 49. The VO signal 41 output by the VCO 47 is divided down in frequency by the first embodiment 38 of the divider circuit, thereby generating local oscillator signal LO2 24. The local oscillator signal LO2 24 includes the signals I, IB, Q and QB. These signals are supplied to mixer 19 of the transmit chain 17 via conductors 50-53, respectively. A multi-bit digital control signal 54 is determined by the processor 55 (see FIG. 4) in digital baseband integrated circuit 4 by the execution of a set of processor-executable instructions 56 stored in a processor-readable medium 57. After the multi-bit digital control signal 54 is determined, it is communicated through serial bus interface 58, across serial bus 27, through serial bus interface 59, and via conductors 30 to local oscillator 20.

PLL 35 of FIG. 6 operates as follows. The externally generated REF CLK 39 on conductor 40 is divided down in frequency by divider 34 so that a lower frequency clock reference signal FREF 60 is supplied onto an input lead 61 of PFD 44. PFD 44 also receives a divided-down single-bit feedback signal DIV_OUT 62 onto input lead 63. From these two signals, PFD 44 generates and supplies an up charge pump control signal UP 64 onto output lead 65 and a down charge pump control signal DN 66 onto output lead 67. Charge pump 45 receives the charge pump control signals UP 64 and DN 66 and generates a charge pump output current pulse train signal onto conductor 68. As a result of low-pass filtering, the resulting tuning signal VTUNE 69 is supplied onto the tuning control input lead 70 of VCO 47. Signal VTUNE 69 is a relatively slow moving DC control signal that controls the VCO 47 to output signal VO 41 onto conductors 42 and 43. Signal VO 41 is divided down in frequency by loop divider 48 to generate signal DIV_OUT 62. The control loop operates by controlling the frequency of the signal VO such that the frequency and phase of signal DIV_OUT is locked to the frequency and phase of signal FREF. Loop divider 48 frequency divides signal VO by a multi-bit digital divisor value received from sigma-delta modulator 49. Sigma-delta modulator 49 changes the divisor value back and forth from an integer value to the next integer over time such that over time the frequency of signal VO is divided by a desired fractional divisor value. Digital baseband processor integrated circuit 4 controls and sets this fractional divisor value by setting multi-bit digital control signal 54.

Figure 7:
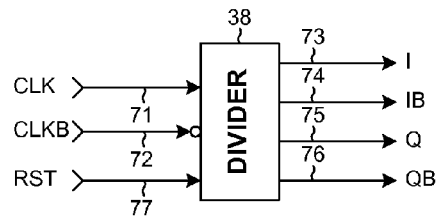
FIG. 7 is a diagram of the block symbol for a first embodiment 38 of the divider circuit of FIG. 6.

FIG. 7 is a diagram of the block symbol for the first embodiment 38 of the divider circuit of FIG. 6. Signals CLK and CLKB of FIG. 7 are a buffered version of differential signal VO 41 of FIG. 6. Signal CLK is received onto divider 38 via conductor and input lead 71. Signal CLKB is received onto divider 38 via conductor and input lead 72. Output signals I, IB, Q and QB are output from the divider circuit and are supplied to mixer 19 via conductors and output leads 73-76, respectively. Output lead 73 and conductor 50 are the same node. Output lead 74 and conductor 51 are the same node. Output lead 75 and conductor 52 are the same node. Output lead 76 and conductor 53 are the same node. In this first embodiment 38 of the divider circuit, a reset signal RST is received onto the divider circuit via input lead 77. The reset signal RST is generated by a control block (not shown) of the RF transceiver integrated circuit 103. The reset signal RST is, for example, asserted for a certain amount of time after a power on condition in order to initialize sequential logic elements of the RF transceiver integrated circuit 3 for subsequent normal circuit operation.

Figure 8:
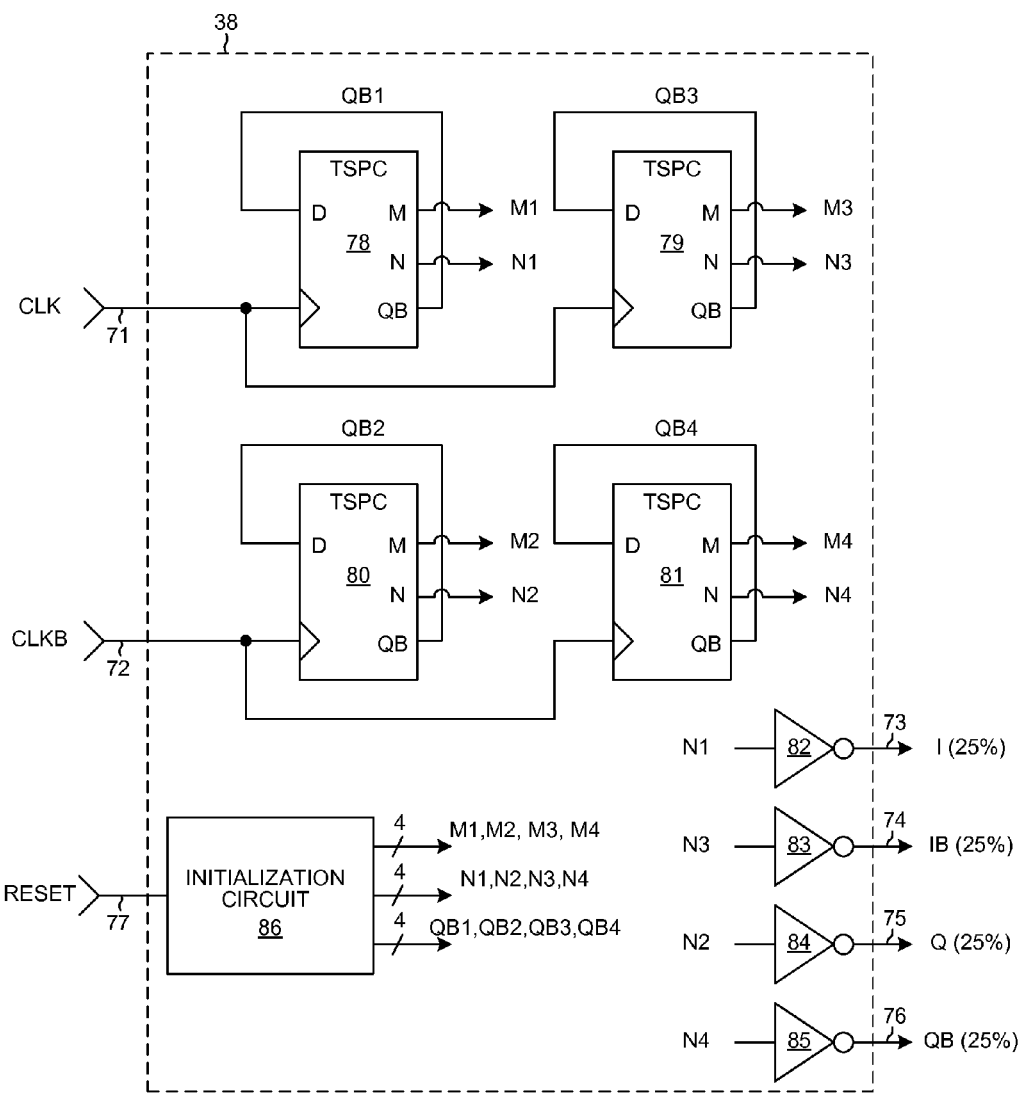
FIG. 8 is a more detailed diagram of the first embodiment 38 of the divider circuit of FIG. 6.

FIG. 8 is a more detailed diagram of the first embodiment 38 of the divider circuit of FIG. 6. The first embodiment 38 of the divider circuit includes four TSPC latches 78-81, four output inverters 82-85, and an initialization circuit 86. The QB output lead of each of the four TSPC latches is connected back to the D input lead of the latch so that the latch operates as a toggling sequential logic element. TSPC latches 78 and 79 are clocked on the rising edge of the clock signal CLK. The initial states to which the latches 78 and 79 are initialized determine the relative phases of the signals output by the latches 78 and 79. Similarly, TSPC latches 80 and 81 are clocked on the falling edge of the clock signal CLK, and the relative phases of the output signals are determined by the initial states to which latches 80 and 81 are initialized. The initial states are set and determined by initialization circuit 86. There are twelve separate initialization signals supplied onto the following nodes: M1, M2, M3, M4, N1, N2, N3, N4, QB1, QB2, QB3 and QB4. Once the initialization circuit 86 has reset the latches, the circuit then exits the initialization mode and starts operating in the normal operating mode. In the normal operating mode, each latch is free-running and operates independently of the other latches and is not affected by the initialization circuit.

Figure 9:
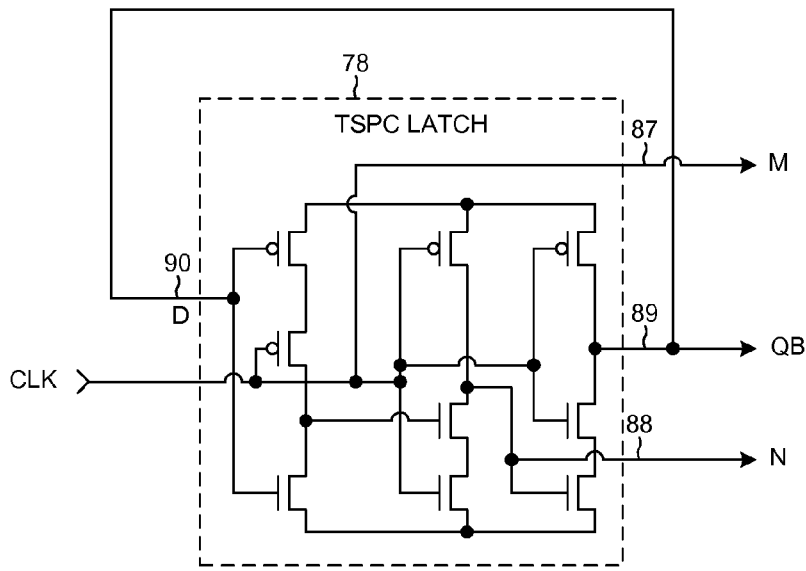
FIG. 9 is a circuit diagram of one of the latches of the first embodiment 38 of the divider circuit of FIG. 6.

FIG. 9 is a circuit diagram of one of the TSPC latches, TSPC latch 78. The other latches 79, 80 and 81 are of identical construction. Latch 78 is a dynamic latch having nine transistors. The QB signal output lead and node 89 is coupled back to the D signal input lead and node 90 so that the latch will toggle. The QB node 89 and the D signal input node 90 are the same node.

Figure 10:
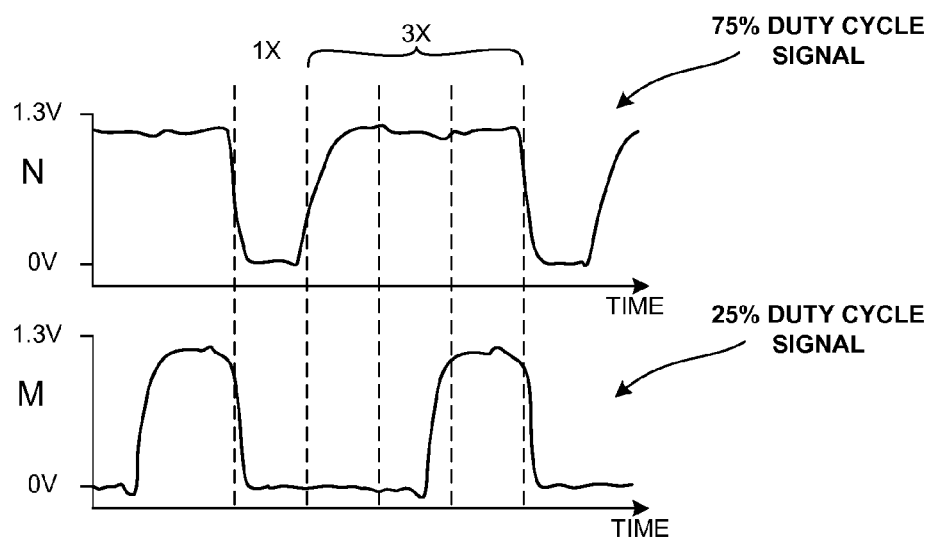
FIG. 10 is a waveform diagram that illustrates signals on the M and N dynamic nodes of the latch of FIG. 9.

FIG. 10 is a waveform diagram that illustrates the signal M on dynamic node 87 of the latch of FIG. 9, and of the signal N on dynamic node 88 of the latch of FIG. 9. Note that the signal N has a 75% duty cycle, and if this signal is inverted then the inverted signal has the desired 25% duty cycle.

Figure 11:
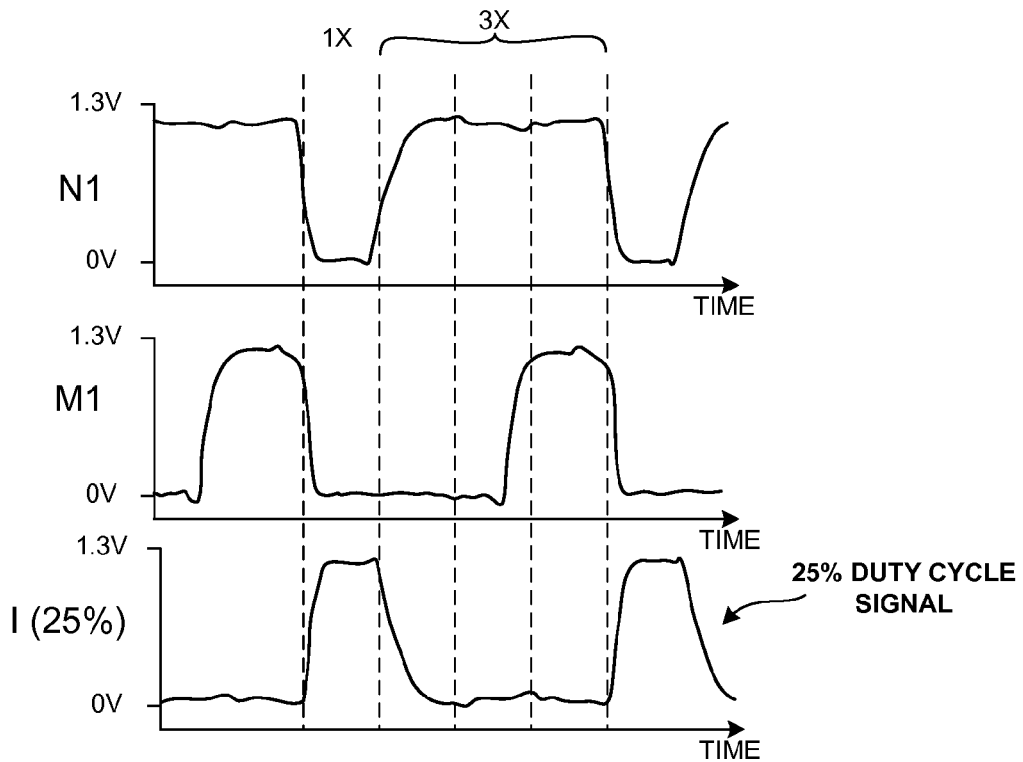
FIG. 11 is a waveform diagram that illustrates how output signal I is generated by the first embodiment 38 of the divider circuit of FIG. 6.

FIG. 11 is a waveform diagram that illustrates how the signal N1 output by latch 78 is used to generate the 25% duty cycle output signal I. An inverter inverts the signal N1 to generate the signal I.

Although the first embodiment 38 of the divider circuit of FIG. 8 operates satisfactorily in some environments and for some applications, it is now recognized by the inventor that the states of latches 78-81 can be erroneously reset. For example, the voltage of the supply voltage may momentarily glitch in magnitude during normal circuit operation when the supply voltage is to be stable. Such a glitch may cause the state of a latch to change erroneously. Once the state of a latch has changed, and once the supply voltage has thereafter returned to a proper voltage level, the state the affected latch may continue to transition normally from that time on but with the wrong phase relationship with respect to the phases output by the other latches. A monitoring circuit could be designed to detect such a situation (where one of the latches has started outputting its output signal in the wrong phase relationship to the phases of the other output signals) and in response to spur the resetting of the latches, but providing such a monitoring circuit is undesirable. The resetting of the latches also causes a transient irregularity in the signals output and this is undesirable. Another possible failure mechanism is that the initialization circuit 86 resets the states of all the latches due to the power supply glitch, and this resetting may give rise to an improper hiccup in the values of all the output signals. After the hiccup, the output signals transition properly one with respect to the others, over time, but at the time of the resetting the output signals momentarily have undesired and incorrect transient wave shapes.

Figure 12:
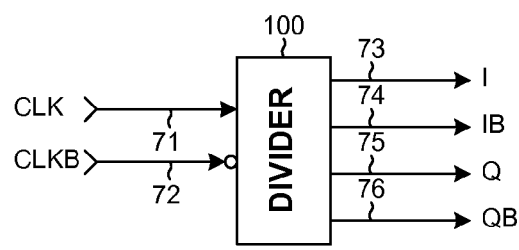
FIG. 12 is a diagram of the block symbol for a second embodiment 100 of the divider circuit of FIG. 6.

FIG. 12 is a diagram of a second embodiment 100 of the divider circuit of FIG. 6. Incoming clock signals CLK and CLKB are the same signals CLK and CLKB shown in FIG. 6. Signal CLK is received onto the divider circuit 100 via conductor and input lead 71. Signal CLKB is received onto divider circuit 100 via conductor and input lead 72. Output signals I, IB, Q and QB are output from the divider circuit and are supplied to mixer 19 via conductors and output leads 73-76, respectively. In this second embodiment 100, there is no reset signal RST as in the first embodiment 38 of FIG. 6.

Figure 13:
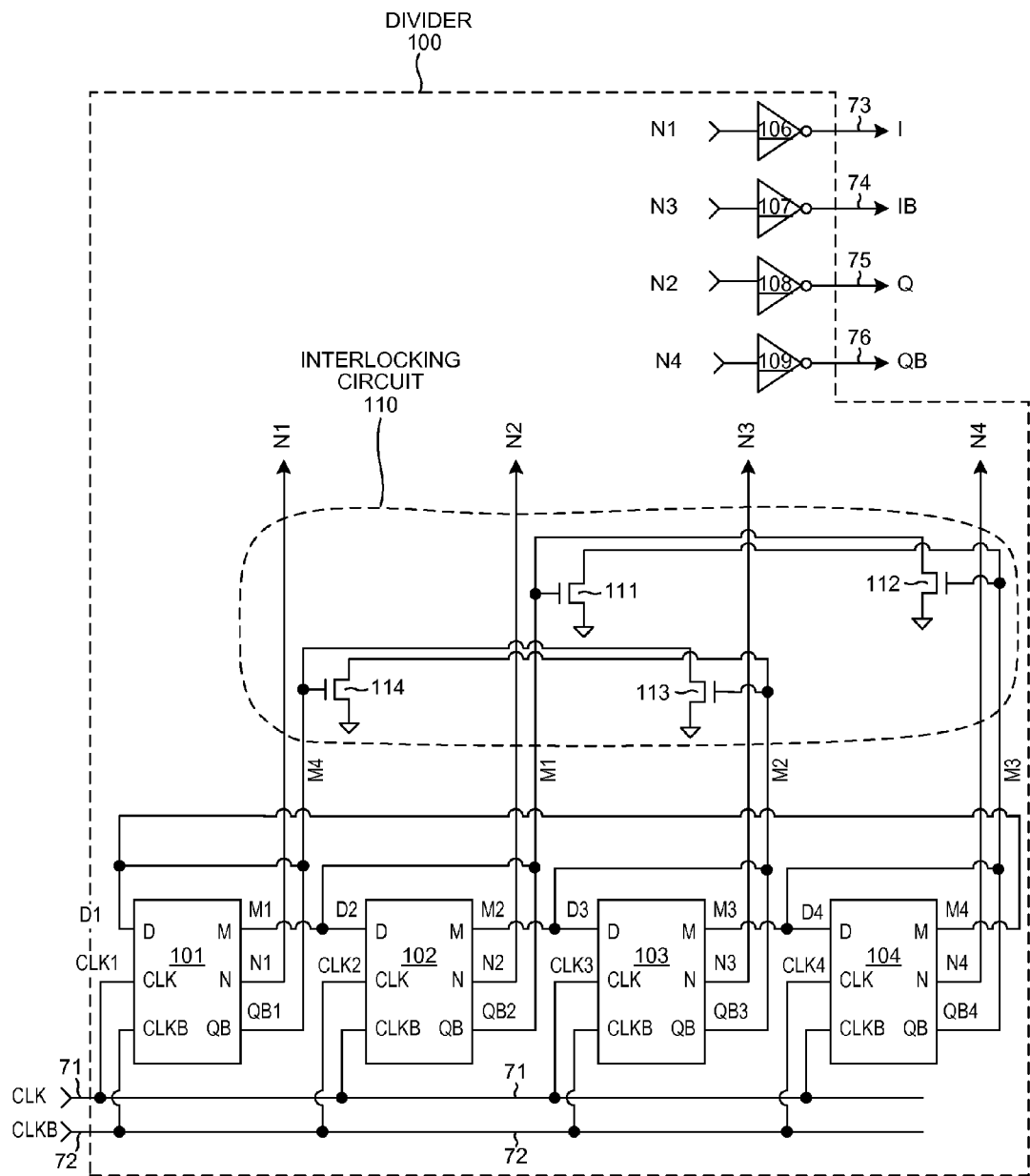
FIG. 13 is a more detailed diagram of the second embodiment 100.

FIG. 13 is a more detailed circuit diagram of the second embodiment 100 of the divider circuit of FIG. 12. The second embodiment 100 of FIG. 13 includes four dynamic latches 101-104, four output inverters 106-109, and an interlocking circuit 110. The dynamic latches may be described as TSPC (True Single Phase Circuit) latches. Each dynamic latch has a D data input node, a CLK input node, a CLKB input node, a first dynamic node M, a second dynamic node N, and a QB data output node. The four dynamic latches are interconnected in a ring configuration such that the M dynamic node of each latch is coupled to the D data input node of the next latch in the ring. The first and third latches are clocked 180 degrees out of phase with respect to the clocking of the second and third latches. This clocking is accomplished by supplying the incoming CLK and CLKB signals onto the CLK and CLKB input leads of the first and third latches in ordinary fashion, but by supplying the CLK and CLKB signals onto the CLK and CLKB input leads of the second and fourth latches in a flipped fashion as illustrated in FIG. 13. Accordingly, the first latch is clocked at the beginning of a clock cycle, then half a clock cycle later the next latch in the ring is clocked.

The signals on the N dynamic nodes of the latches are inverted by the output inverters 106-109 to generate the four 25% duty cycle output signals I, IB, Q and QB, so at a given time only one of the signals N1, N2, N3 and N4 is low. As the divider is clocked, the latch whose N dynamic node is outputting the low signal rotates around the ring. Unlike the divider circuit of FIG. 8 where the latches 78-81 operate independently unless they are being initialized, in the divider circuit of FIG. 13 the latches 101-104 do not operating independently in that: 1) the latches are organized in a ring with the M dynamic node of a latch being coupled to the D input of the next latch, and 2) the interlocking circuit 110 affects the states of latches based on the state or states of another one or more of the latches. Operation of one example of the interlocking circuit 110 is described in more detail below.

The interlocking circuit 110 of FIG. 13, unlike the initialization circuit 86 of FIG. 8, does not receive any reset signal. The interlocking circuit 110 does not receive any digital input signal from any source other than from the dynamic latches. The interlocking circuit 110 does not receive any external digital control signal that causes it to reset the states of latches 101-104 in a reset mode, and then to disable itself for operation in another mode. Rather, the interlocking circuit 110 only has one operating mode and is operational continuously in the same mode and is always influencing the states of the latches so that the output signals I, IB, Q and QB remain in a proper relationship with respect to one another. Although the N1, N2, N3 and N4 signals are illustrated in FIG. 13 as going through the interlocking circuit 110, it is noted that the signals N1, N2, N3 and N4 are not actually received by any circuitry of the interlocking circuit 110. The passing of the N1, N2, N3 and N4 signals through the area in the diagram bounded by dashed line 110 is simply an aspect of the drawing. The interlocking circuit 110 does not use, receive, or operate on any of the N1, N2, N3 and N4 signals.

If for some reason the states of the four latches were to be in an illegal condition in which more than one of the N dynamic nodes are outputting a digital low at a given time, then the interlocking circuit 110 would influence the dynamic M nodes (for example, by pulling one or more of the M nodes low at the appropriate time) such that after a few clock cycles one and only one of the N dynamic nodes would be outputting a digital low at a given time. If a digital logic high is present on the M dynamic node of the first latch 101, then the first N-channel pulldown transistor 111 is on, and the M dynamic node of the third latch 103 is pulled low. Conversely, if the M dynamic node of the third latch 103 is high, then the second N-channel pulldown transistor 112 is on, and the M dynamic node of the first latch 101 is pulled low. Only one of the M dynamic nodes of the first the third latches can be high at a given time. Accordingly, upon the next edge of the CLK signal, the signal values on the two dynamic M nodes are clocked into the second and fourth latches. Only one of the second and fourth latches therefore clocks in a high D signal value.

Likewise, if a digital logic high is present on the M dynamic node of the second latch 102, then the third N-channel pulldown transistor 113 is on, and the M dynamic node of the fourth latch 104 is pulled low. Conversely, if the M dynamic node of the fourth latch 104 is high, then the fourth N-channel pulldown transistor 114 is on, and the M dynamic node of the second latch 102 is pulled low. Only one of the M dynamic nodes of the second and fourth latches can be high at a given time. Accordingly, upon the next edge of the CLK signal the values on the two dynamic M nodes are clocked into the third and first latches. Only one of the third and first latches therefore clocks in a D high value. The explanation above is somewhat simplified. Signals may be not be fully digital at proper digital logic levels at times when the interlocking circuit 110 is correcting latch operation. For a more detailed understanding of the operation of the divider circuit, the divider circuit should be simulated or the circuit should be fabricated and studied. It is to be understood that not all of the pulldown transistors may be required. Accordingly, in some examples the interlocking circuit 110 includes only a subset of the four N-channel pulldown transistors 111-114.

Proper operation of the overall divider is confirmed by recording all possible states of the divider circuit. Because each latch has two dynamic nodes, and because there are four latches, there are a tremendous number of states. To simply the analysis, the number of states to consider is reduced by recording as different conditions only conditions for an M node being low, for the M node being in a fight condition, or for the M node being in an unknown state. A fight condition is a condition in which the voltage on the node is simultaneously being pulled high through a transistor and pulled low through another transistor. Once all the states of the divider are recorded using these conditions to reduce the number of states, then each state in which an M node is in the unknown condition considered separately. For each such state, the clock signal is clocked, and the values on each of the eight nodes of the divider are updated, clock by clock. For each such state, it is demonstrated that after a few clock cycles there are no M nodes in the divider circuit that have unknown states, and the N dynamic node of only one latch is outputting a low at a given time. As a result of the interlocking circuit 110, and as a result of how the CLK and CLKB signals are supplied to the latches 101-104, the states of the four latches in operation always are resolved so that the output signals I, IB, Q and QB have the desired phase relationship, and so that each of the output signals is a 25% duty cycle signal.

Figure 14:
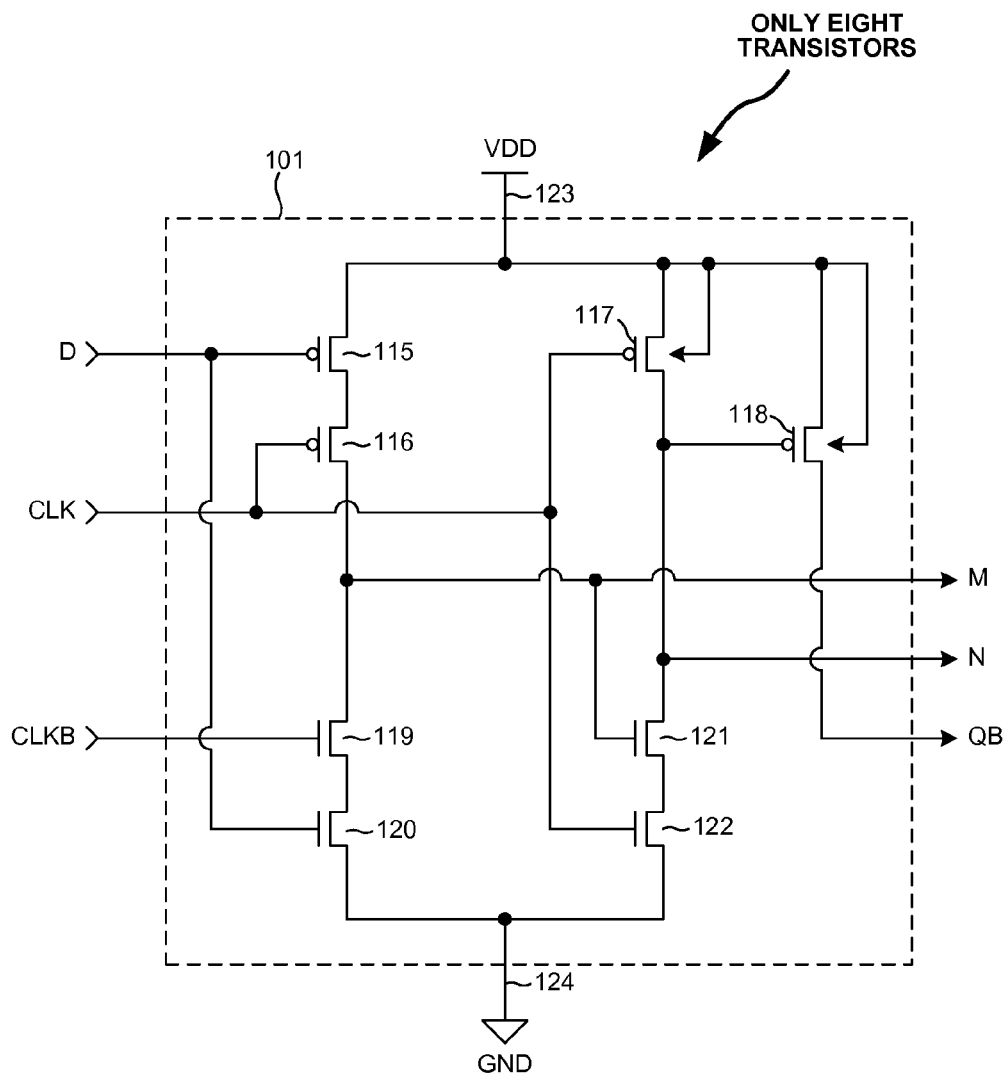
FIG. 14 is a circuit diagram of one of the latches of the second embodiment 100.

FIG. 14 is a more detailed circuit diagram of one of the dynamic latches of the divider circuit of FIG. 13, TSPC latch 101. Whereas the latch of FIG. 9 has nine transistors, the latch 101 of FIG. 14 only has eight transistors. When the latch of FIG. 9 is considered in the circuit of FIG. 13 with interlocking circuit 110, it is recognized that some nodes of the latch of FIG. 9 always have the same signals. Accordingly, there are redundant nodes in the circuit. The result of consolidating the redundant nodes and eliminating the redundant transistors is the eight-transistor dynamic latch 101 of FIG. 14.

In FIG. 14, transistors 115-118 are P-channel transistors. Transistors 119-122 are N-channel transistors. First P-channel transistor 115 and second P-channel transistor 116 are coupled in series between a supply voltage conductor 123 and the dynamic node M of the latch. First N-channel transistor 119 and second N-channel transistor 120 are coupled in series between node M and a ground conductor 124. The gate of the first P-channel transistor 115 and the gate of the second N-channel transistor 120 are coupled to the D input signal node of the latch. The gate of the first N-channel transistor 119 is coupled to an inverted clock signal input node CLKB of the latch. The third P-channel transistor 117 is coupled between the supply voltage conductor 123 and the dynamic node N of the latch. The third N-channel transistor 121 and the fourth N-channel transistor 122 are coupled in series between node N and the ground conductor 124. The gate of the third N-channel transistor 121 is coupled to node M, and to the drains of second P-channel transistor 116 and first N-channel transistor 119. The gate of the fourth N-channel transistor 122 is coupled to the gate of the third P-channel transistor 117 and to the gate of the second P-channel transistor 116 and to the clock signal input node CLK of the latch. The fourth P-channel transistor 118 is coupled between the supply voltage conductor 123 and a QB output signal node of the latch. The gate of the fourth P-channel transistor 118 is coupled to dynamic node N.

All the latches 101-104 of FIG. 13 are identical. Each of the latches 101-104 has the circuit topology illustrated in FIG. 14.

Figure 15:
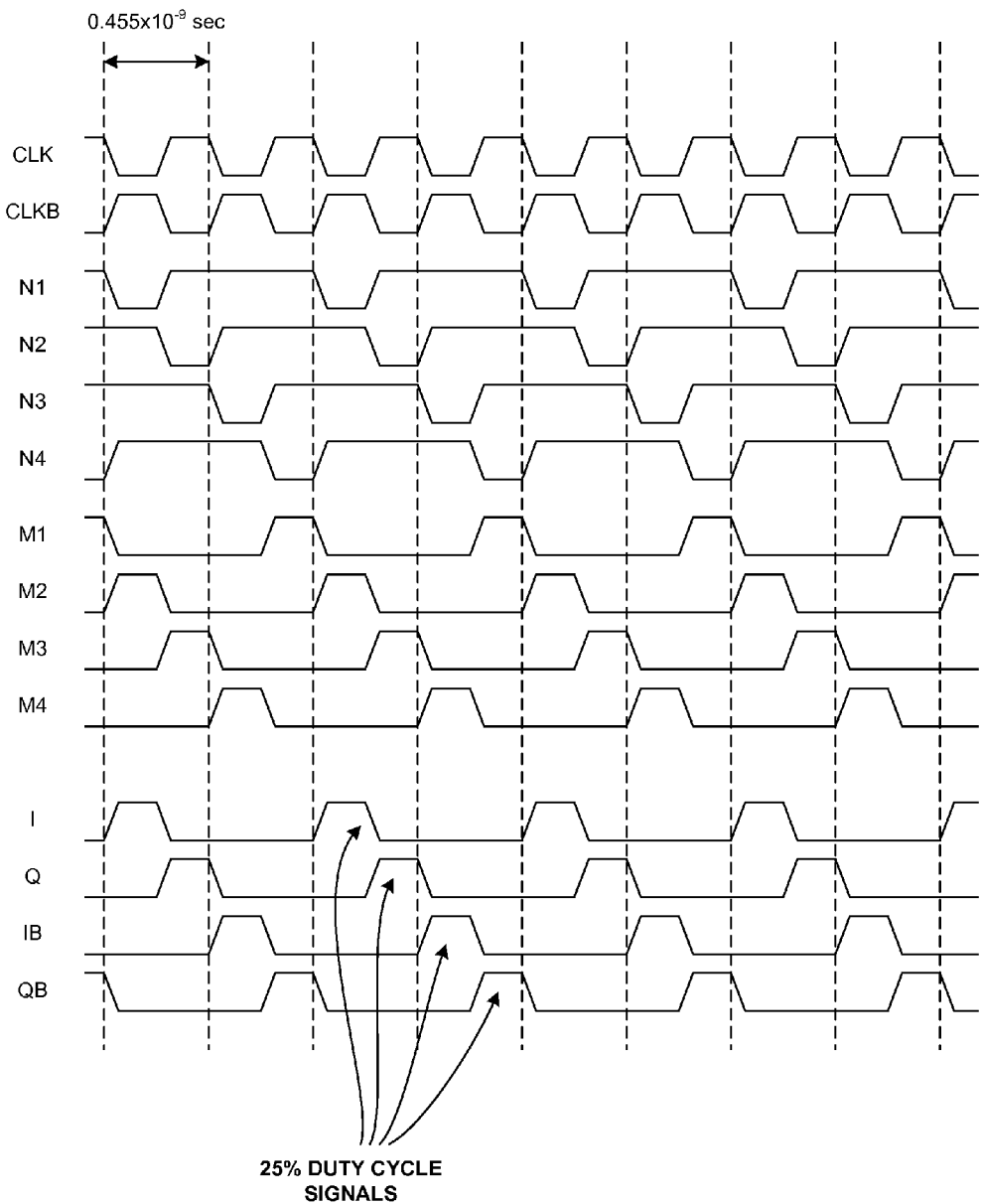
FIG. 15 is a waveform diagram that illustrates operation of second embodiment 100.

FIG. 15 is a simplified waveform diagram that illustrates operation of the second embodiment 100 of the divider circuit of FIG. 6. The simplified N1, N2, N3 and N4 waveforms indicate how the states of the four latches change with respect to one another. Only one of the N dynamic nodes is outputting a low at a given time, and which one of the four latches it is that is outputting the low cycles through the ring of latches from the first latch 101, to the second latch 102, to the third latch 103, to the fourth latch 104, back to the first latch, and so forth around the ring. Each of the output signals I, IB, Q and QB is a 25% duty cycle signal.

Figure 1:
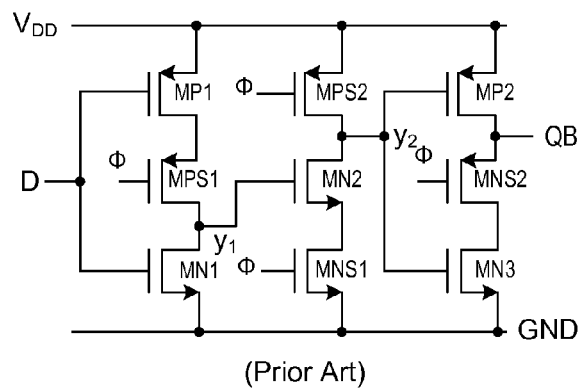
FIG. 1 (Prior Art) is a diagram of a first prior art latch.
Figure 2:
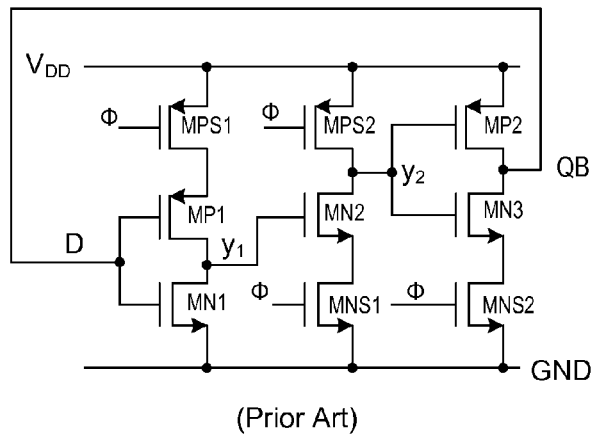
FIG. 2 (Prior Art) is a diagram of a second prior art latch.
Figure 3:
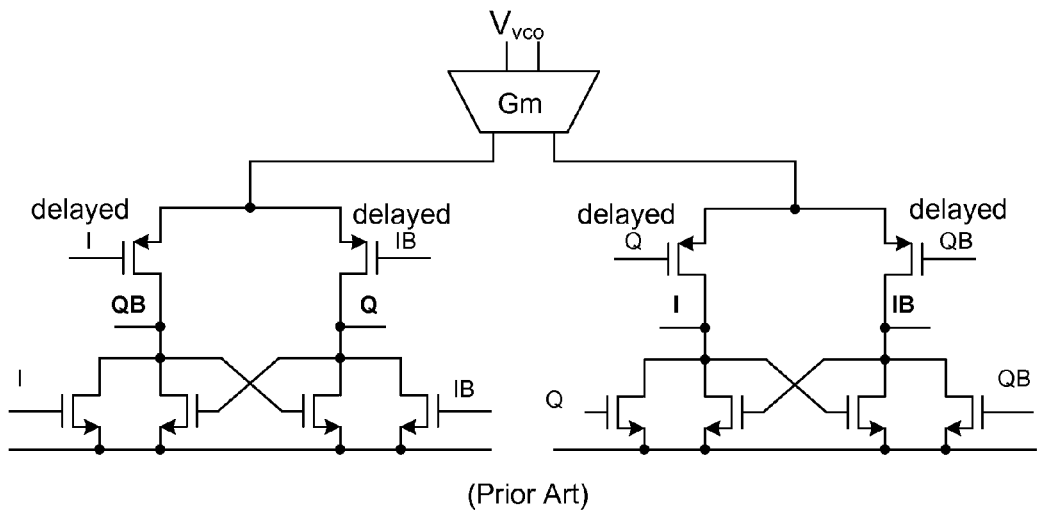
FIG. 3 (Prior Art) is a diagram of a prior art divider.

FIG. 16 is a table that sets forth performance parameters of the second embodiment 100 of the divider circuit of FIG. 13, in comparison to performance parameters for the first embodiment 38 of the divider circuit of FIG. 8, and in comparison to performance parameters for the prior art pseudo-CML divider circuit of FIG. 3. In the notation used, the first letter in the manufacturing process notation indicates the speed of N-channel transistors, and the second letter in the manufacturing process notation indicates the speed of the P-channel transistors. "S" denotes slow, "T" denotes typical, and "F" denotes fast.

For a TT process corner, for a supply voltage of 0.9 volts, at 50 degrees Celsius, and a clock frequency of 2.2 GHz, the second embodiment 100 of the divider circuit of FIG. 13 and the pre-divider buffer 37 of FIG. 6 together consume about 10.94 mA, as compared to a higher 12.42 mA current consumption number for the first embodiment 38 of the divider circuit of FIG. 8 and the pre-divider buffer 37 of FIG. 6, and as compared to a higher 13.03 mA current consumption number for the prior art divider of FIG. 3 and the pre-divider buffer 37 of FIG. 6 (if the prior art divider of FIG. 3 were incorporated into the local oscillator of FIG. 6). Total current consumption is less than 11.84 mA over all process corners, and over the entire temperature range from −30 degrees Celsius to 110 degrees Celsius. The numbers of the table of FIG. 16 are simulated values.

Not only is the second embodiment 100 of the divider circuit of FIG. 13 superior in terms of having lower power consumption, but the second embodiment 100 of the divider circuit of FIG. 13 also outputs signals having less phase noise (−155.7 dBc/Hz) as compared to the phase noise of signals output by the first embodiment 38 of the divider circuit of FIG. 8 (−154.9 dBc/Hz), and as compared to the phase noise of signals output by the prior art pseudo-CML divider of FIG. 3 (−154.8 dBc/Hz). The 80 MHz notation in the reference to phase noise in the table of FIG. 16 indicates an 80 MHz offset from the final divided frequency of 2 GHz. Phase noise at all process corners is more negative than (better than) −150 dBc/Hz.

Figure 17:
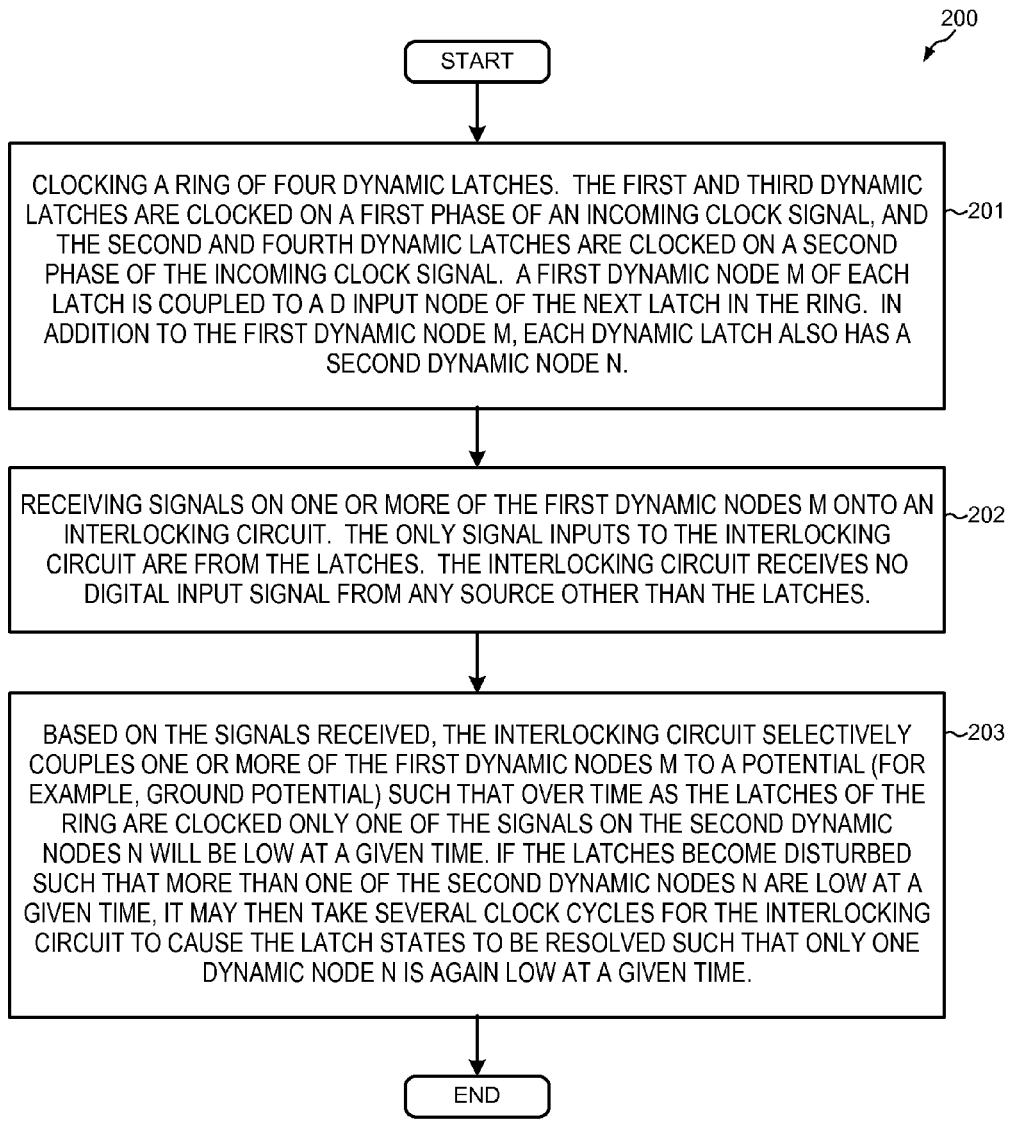
FIG. 17 is a flowchart of a method 200 in accordance with one novel aspect.

FIG. 17 is a flowchart of a method 200. A ring of four dynamic latches is clocked (step 201). The first and third dynamic latches of the ring are clocked on a first phase of an incoming clock signal, whereas the second and fourth dynamic latches of the ring are clocked on a second phase of the incoming clock signal. The first phase may start on the rising edge of a period of the clock signal and the second phase may start on the falling edge of the period of the clock signal. In one example, each dynamic latch has only eight transistors and has a first dynamic node M, a second dynamic node N, a clock input signal node, a QB data output signal node, and a D data input signal node. The first dynamic node M of each latch is coupled to the D data input signal node of the next latch in the ring.

Signals on one or more of the first dynamic nodes M of the four latches of the ring are received (step 202) onto an interlocking circuit. The only signal inputs to the interlocking circuit are from the latches. The interlocking circuit receives no digital input signal from any source other than from the latches.

Based on the signals received onto the interlocking circuit, the interlocking circuit selectively couples (step 203) one or more of the dynamic nodes M to a potential (for example, ground potential) at the appropriate time such that over time, as the latches of the ring are clocked, only one of the signals on the four second dynamic nodes N will be low at a given time. As the ring is clocked, the low N node value moves around the ring, from node N to node N, from latch to latch. The signal on each dynamic node N has a 75% duty cycle. In one example, each of the four N node signals is inverted and is output as a 25% duty cycle signal. The resulting four inverted signals (the 25% duty cycle signals) are the I, Q, IB and QB signals that are used to drive a passive mixer such as, for example, a passive mixer in a radio receiver or in a radio transmitter. If the four dynamic latches become disturbed such that more than one of the nodes N has a low signal at a given time, then it may take several clock cycles for the interlocking circuit to cause the latch states to resolve such that only one of the node N signals is again low at a given time.

Although certain specific embodiments are described above for instructional purposes, the teachings of this patent document have general applicability and are not limited to the specific embodiments described above. Although an example of the interlocking circuit is set forth that involves pulldown transistors, in other examples dynamic nodes are pulled up to the supply voltage by pullup transistors at the appropriate times to accomplish the same function. In some examples the dynamic nodes M are influenced by the interlocking circuit to affect the states of the latches. In other examples the nodes N are influenced by the interlocking circuit to affect the states of the latches. A complement of the divider circuit can be made by reversing the transistor device types such that P-channel transistors are replaced with N-channel transistors and such that N-channel transistors are replaced with P-channel transistors. Accordingly, various modifications, adaptations, and combinations of the various features of the described specific embodiments can be practiced without departing from the scope of the claims that are set forth below.

What is claimed is:

1. A divider comprising:
a first dynamic latch having clock signal input node CLK1, a signal input node D1, a first dynamic signal output node M1, and a second dynamic signal output node N1;
a second dynamic latch having clock signal input node CLK2, a signal input node D2, a first dynamic signal output node M2, and a second dynamic signal output node N2, wherein D2 is coupled to M1;
a third dynamic latch having a clock signal input node CLK3, a signal input node D3, a first dynamic signal output node M3, and a second dynamic signal output node N2, wherein D3 is coupled to M2;
a fourth dynamic latch having clock signal input node CLK4, a signal input node D4, a first dynamic signal output node M4, and a second dynamic signal output node N4, wherein D4 is coupled to M3, and wherein M4 is coupled to Dl, wherein there are signals on the M1, M2, M3 and M4 nodes, and wherein there are signals on the N1, N2, N3 and N4 nodes;
a clock signal conductor that is coupled to the clock signal input nodes CLK1 and CLK3 of the first and third dynamic latches;
an inverted clock signal conductor that is coupled to the clock signal input nodes CLK2 and CLK4 of the second and fourth dynamic latches; and
an interlocking circuit coupled to M1, M2, M3 and M4, wherein the interlocking circuit receives no input signal other than the signals on the M1, M2, M3 and M4 nodes, and wherein the interlocking circuit selectively controls one or more logic values on one or more of the M1, M2, M3 and M4 nodes such that as the divider is clocked only one of the signals on the N1, N2, N3 and N4 nodes will be low at a given time.

2. The divider of claim 1, wherein the first and third dynamic latches are clocked together at a first phase of a clock signal on the clock signal conductor, and wherein the second and fourth dynamic latches are clocked together at a second phase of the clock signal on the clock signal conductor.

3. The divider of claim 1, wherein each of the first, second, third and fourth dynamic latches is identical to each of the others of the first, second, third and fourth dynamic latches.

4. The divider of claim 3, wherein the first dynamic latch comprises:

a first P-channel transistor and a second P-channel transistor coupled in series between a supply voltage conductor and M1;
a first N-channel transistor and a second N-channel transistor coupled in series between M1 and a ground conductor, wherein a gate of the first P-channel transistor and a gate of the second N-channel transistor are coupled to the D1 input signal node of the first dynamic latch, and wherein a gate of the first N-channel transistor is coupled to an inverted clock signal input node of the first dynamic latch;
a third P-channel transistor coupled between the supply voltage conductor and N1;
a third N-channel transistor and a fourth N-channel transistor coupled in series between N1 and the ground conductor, wherein a gate of the third N-channel transistor is coupled to M1, wherein a gate of the fourth N-channel transistor is coupled to a gate of the third P-channel transistor and to a gate of the second P-channel transistor and to the clock signal input node CLK1 of the first dynamic latch; and
a fourth P-channel transistor coupled between the supply voltage conductor and a QB output signal node of the first dynamic latch, wherein a gate of the fourth P-channel transistor is coupled to N1.

5. The divider of claim 1, wherein each of the first, second, third and fourth dynamic latches comprises no more than eight transistors.

6. The divider of claim 1, wherein the interlocking circuit comprises no more than four transistors.

7. The divider of claim 1, wherein the interlocking circuit comprises:
a first N-channel pulldown transistor having a gate coupled to M1, having a source coupled to a ground conductor, and having a drain coupled to M3;
a second N-channel pulldown transistor having a gate coupled to M3, having a source coupled to the ground conductor, and having a drain coupled to M1;
a third N-channel pulldown transistor having a gate coupled to M2, having a source coupled to the ground conductor, and having a drain coupled to M4; and
a fourth N-channel pulldown transistor having a gate coupled to M4, having a source coupled to the ground conductor, and having a drain coupled to M2.

8. The divider of claim 1, wherein the first dynamic latch has a QB1 signal output node that is coupled to the D1 signal input node, wherein the second dynamic latch has a QB2 signal output node that is coupled to the D2 signal input node, wherein the third dynamic latch has a QB3 signal output node that is coupled to the D3 signal input node, and wherein the first dynamic latch has a QB4 signal output node that is coupled to the D4 signal input node.

9. The divider of claim 1, wherein signals having duty cycles of approximately seventy-five percent are present on the N1, N2, N3 and N4 nodes, and wherein signals having duty cycles of approximately twenty-five percent are present on the M1, M2, M3 and M4 nodes.

10. A divider comprising:
a first dynamic latch having clock signal input node CLK1, a signal input node D1, a first dynamic signal output node M1, and a second dynamic signal output node N1;
a second dynamic latch having clock signal input node CLK2, a signal input node D2, a first dynamic signal output node M2, and a second dynamic signal output node N2, wherein D2 is coupled to M1;
a third dynamic latch having a clock signal input node CLK3, a signal input node D3, a first dynamic signal output node M3, and a second dynamic signal output node N2, wherein D3 is coupled to M2, wherein the clock signal input node CLK3 of the third dynamic latch is coupled to the clock signal input node CLK1 of the first dynamic latch;

a fourth dynamic latch having clock signal input node CLK4, a signal input node D4, a first dynamic signal output node M4, and a second dynamic signal output node N4, wherein D4 is coupled to M3, wherein M4 is coupled to D1, wherein the clock signal input node CLK4 of the fourth dynamic latch is coupled to the clock signal input node CLK2 of the second dynamic latch, wherein there are signals on the M1, M2, M3 and M4 nodes, and wherein there are signals on the N1, N2, N3 and N4 nodes; and means for selectively controlling one or more logic values on one or more of M1, M2, M3 and M4 such that as the divider is clocked only one of the signals on the N1, N2, N3 and N4 nodes will be low at a given time, wherein the means receives no digital input signal other than the signals on the M1, M2, M3 and M4 nodes.

11. The divider of claim 10, the means comprises:
a first N-channel pulldown transistor having a gate coupled to M1, having a source coupled to a ground conductor, and having a drain coupled to M3;
a second N-channel pulldown transistor having a gate coupled to M3, having a source coupled to the ground conductor, and having a drain coupled to M1;
a third N-channel pulldown transistor having a gate coupled to M2, having a source coupled to the ground conductor, and having a drain coupled to M4; and
a fourth N-channel pulldown transistor having a gate coupled to M4, having a source coupled to the ground conductor, and having a drain coupled to M2.

12. The divider of claim 10, wherein the means is for pulling the signal on one of the M1, M2, M3 and M4 nodes low when the signal on another of the M1, M2, M3 and M4 nodes is high.

13. The divider of claim 10, wherein each of the first, second, third and fourth dynamic latches comprises no more than eight transistors.

14. The divider of claim 10, further comprising:
a clock signal conductor that is coupled to the CLK1 clock signal input node of the first dynamic latch and to the CLK3 clock signal input node of the third dynamic latch; and
an inverted clock signal conductor that is coupled to the CLK2 clock signal input node of the second dynamic latch and to the CLK4 clock signal input node of the fourth dynamic latch.

15. A dynamic latch comprising:
a first P-channel transistor and a second P-channel transistor coupled in series between a supply voltage conductor and a dynamic node M;
a first N-channel transistor and a second N-channel transistor coupled in series between the dynamic node M and a ground conductor, wherein a gate of the first P-channel transistor and a gate of the second N-channel transistor are coupled to a D input signal node of the dynamic latch, and wherein a gate of the first N-channel transistor is coupled to an inverted clock signal input node CLKB of the dynamic latch;
a third P-channel transistor coupled between the supply voltage conductor and a dynamic node N; and
a third N-channel transistor and a fourth N-channel transistor coupled in series between the dynamic node N and the ground conductor, wherein a gate of the third N-channel transistor is coupled to the dynamic node M, wherein a gate of the fourth N-channel transistor is coupled to a gate of the third P-channel transistor and to a gate of the second P-channel transistor and to a clock signal input node CLK of the dynamic latch.

16. The dynamic latch of claim 15, further comprising:
a fourth P-channel transistor coupled between the supply voltage conductor and a QB output signal node of the dynamic latch, wherein a gate of the fourth P-channel transistor is coupled to the dynamic node N.

17. A method comprising:
(a) clocking a ring of dynamic latches, wherein a first dynamic node M of a first latch of the ring is coupled to a data input node of a second latch of the ring, wherein a first dynamic node M of the second latch of the ring is coupled to a data input node of a third latch of the ring, wherein a first dynamic node M of the third latch of the ring is coupled to a data input node of a fourth latch of the ring, wherein a first dynamic node M of the fourth latch of the ring is coupled to a data input node of the first latch of the ring, wherein each of the first, second, third and fourth dynamic latches also has a second dynamic node N, wherein there are signals on the second dynamic nodes N;
(b) receiving signals on one or more of the first dynamic nodes M onto an interlocking circuit; and
(c) based on the signals received in (b) selectively coupling one or more of the first dynamic nodes M to ground potential such that over time as the latches of the ring are clocked in (a) only one of the signals on the second dynamic nodes N will be low at a given time, wherein the interlocking circuit performs the selective coupling of (c), and wherein the interlocking circuit in (b) and in (c) receives no input signal other than the one or more signals of the first dynamic nodes M received in (b).

18. The method of claim 17,
wherein a signal from the first dynamic node M of the first latch is received onto a gate of a first N-channel pulldown transistor of the interlocking circuit, wherein a drain of the first N-channel pulldown transistor is coupled to the dynamic node of the third latch of the ring;
wherein a signal from the first dynamic node M of the third latch is received onto a gate of a second N-channel pulldown transistor of the interlocking circuit, wherein a drain of the second N-channel pulldown transistor is coupled to the dynamic node of the first latch of the ring;
wherein a signal from the first dynamic node M of the second latch is received onto a gate of a third N-channel pulldown transistor of the interlocking circuit, wherein a drain of the third N-channel pulldown transistor is coupled to the dynamic node of the fourth latch of the ring; and
wherein a signal from the first dynamic node M of the fourth latch is received onto a gate of a fourth N-channel pulldown transistor of the interlocking circuit, wherein a drain of the fourth N-channel pulldown transistor is coupled to the dynamic node of the second latch of the ring.

19. The method of claim 17, further comprising:
generating an inverted version of each of the signals on the second dynamic nodes N thereby generating four twenty-five percent duty cycle signals.

20. The method of claim 17, wherein each of the dynamic latches of the ring includes no more than eight transistors.

* * * * *